(12) United States Patent
Pille et al.

(10) Patent No.: US 11,328,110 B2
(45) Date of Patent: May 10, 2022

(54) INTEGRATED CIRCUIT INCLUDING LOGIC CIRCUITRY

(71) Applicant: INTERNATIONAL BUSINESS MACHINES CORPORATION, Armonk, NY (US)

(72) Inventors: Juergen Pille, Stuttgart (DE); Tobias Werner, Weil im Schoenbuch (DE); Shankar Kalyanasundaram, Bengaluru (IN); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 16/838,073

(22) Filed: Apr. 2, 2020

(65) Prior Publication Data

US 2021/0312116 A1 Oct. 7, 2021

(51) Int. Cl.
*G06F 30/392* (2020.01)
*G11C 5/02* (2006.01)
*H01L 27/092* (2006.01)
*H01L 27/11* (2006.01)
*G11C 5/06* (2006.01)

(52) U.S. Cl.
CPC ............ *G06F 30/392* (2020.01); *G11C 5/025* (2013.01); *G11C 5/06* (2013.01); *H01L 27/0924* (2013.01); *H01L 27/1104* (2013.01)

(58) Field of Classification Search
CPC .............................. G06F 30/392; G11C 5/025
USPC ......................................................... 716/119
See application file for complete search history.

(56) References Cited

U.S. PATENT DOCUMENTS

| | | | |
|---|---|---|---|
| 9,007,095 B2 | 4/2015 | Penzes | |
| 10,050,042 B2 | 8/2018 | Chen | |
| 2006/0190893 A1 | 8/2006 | Morton | |
| 2018/0150592 A1* | 5/2018 | Chang | H01L 27/0207 |
| 2020/0006481 A1* | 1/2020 | Yang | H01L 27/0924 |
| 2020/0074042 A1* | 3/2020 | Biswas | G06F 30/398 |

FOREIGN PATENT DOCUMENTS

| | | |
|---|---|---|
| EP | 1269541 A1 | 1/2003 |
| JP | 4410380 B2 | 2/2010 |

* cited by examiner

*Primary Examiner* — Suchin Parihar
(74) *Attorney, Agent, or Firm* — John Noh (57) ABSTRACT

An integrated circuit includes at least one first area including logic circuitry. The logic circuitry includes library blocks selected from a logic circuit library. A first one of the library blocks is provided with at least two symmetry mirror edges perpendicular to a height of the library blocks. Two adjacent ones of the library blocks are joined at a common symmetry mirror edge.

15 Claims, 9 Drawing Sheets

PRIOR ART

| # of 9T | # of 12T | Image |
|---|---|---|
| 1 | 0 | 9 |
| 0 | 1 | 12 |
| 2 | 0 | 18 |
| 1 | 1 | 21 |
| 0 | 2 | 24 |
| 3 | 0 | 27 |
| 2 | 1 | 30 |
| 1 | 2 | 33 |
| 4 | 0 | 36 |
| 0 | 3 | 36 |
| 3 | 1 | 39 |
| 2 | 2 | 42 |
| 1 | 3 | 45 |
| 5 | 0 | 45 |
| 4 | 1 | 48 |
| 0 | 4 | 48 |
| 3 | 2 | 51 |
| 2 | 3 | 54 |
| 6 | 0 | 54 |
| 1 | 4 | 57 |
| 5 | 1 | 57 |
| 4 | 2 | 60 |
| 0 | 5 | 60 |

INTEGRATED CIRCUIT INCLUDING LOGIC CIRCUITRY

The present invention relates in general to data processing systems, in particular, to an integrated circuit comprising at least one first area including logic circuitry.

BACKGROUND

When producing integrated circuits, a number of process layers are formed on a substrate, each process layer incorporating a layout pattern. The layout patterns within the various layers establish component features and interconnections such that once the final process layer has been formed, an integrated circuit has been produced containing all of the required circuit components interconnected in the manner required to perform the functions of the integrated circuit.

For a new integrated circuit, a layout of that integrated circuit will be produced in the form of a data file identifying the required layout patterns for each of the process layers. To assist in the generation of such a layout, it is known to use cell libraries providing a plurality of different cells, each cell defining a layout for a particular component. Various types of cells are used in modern systems for generating integrated circuit layouts, for example, standard cells, data path cells, custom cells, cells representing portions of a memory device, etc.

For designing an integrated circuit, e.g., logic circuitry like logic images as well as array circuits like SRAM images may be arranged in a specific layout. In an area of the integrated circuit which is foreseen for a logic image, the chip is normally organized in so-called circuit rows with a modular form factor and the same height. The height of the circuit row is measured in metal tracks; 9 track (9T) means height of the circuit row. In such a circuit row, e.g. transistors are implemented, where one row may be foreseen for positive metal oxide semiconductor (PMOS) transistors and another row may be reserved for negative metal oxide semiconductor (NMOS) transistors.

SRAM images are arranged in a different area of the chip and normally exhibit a different height than the logic image. The same idea of standardization for logic images may prove to be productive and enable tools.

SUMMARY

An integrated circuit is proposed comprising at least one first area including logic circuitry, wherein the logic circuitry comprises library blocks selected from a logic circuit library. A library block is provided with at least two symmetry mirror edges perpendicular to a height of the library blocks. Two adjacent library blocks are joined at a common symmetry mirror edge.

The common symmetry mirror edge corresponds to the same symmetry mirror edge on both library blocks.

Advantageously the integrated circuit may further comprise at least one second area including an array circuit, the first area and the second area having a common boundary. The array circuit is subdivided into multiple adjacent cells placed in the second area so that adjacent boundaries of the cells correspond to the common boundary. The height of at least one cell may correspond to the height of one or more adjacent library blocks facing the cell at the common boundary. Corresponding cells and library blocks may be aligned to each other regarding their boundaries along the common boundary.

BRIEF DESCRIPTION OF THE SEVERAL VIEWS OF THE DRAWINGS

The following detailed description, given by way of example and not intended to limit the exemplary embodiments solely thereto, will best be appreciated in conjunction with the accompanying drawings, in which.

The drawings are not necessarily to scale. The drawings are merely schematic representations, not intended to portray specific parameters of the exemplary embodiments. The drawings are intended to depict only typical exemplary embodiments. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. The exemplary embodiments are only illustrative and may, however, be embodied in many different forms and should not be construed as limited to the exemplary embodiments set forth herein. Rather, these exemplary embodiments are provided so that this disclosure will be thorough and complete, and will fully convey the scope to be covered by the exemplary embodiments to those skilled in the art. In the description, details of well-known features and techniques may be omitted to avoid unnecessarily obscuring the presented embodiments.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the interest of not obscuring the presentation of the exemplary embodiments, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements according to the various exemplary embodiments.

The illustrative embodiments described herein provide an integrated circuit comprising at least one first area including logic circuitry, wherein the logic circuitry comprises library blocks selected from a logic circuit library, wherein a library block is provided with at least two symmetry mirror edges perpendicular to a height of the library blocks, wherein two adjacent library blocks are joined at a common symmetry mirror edge. The common symmetry mirror edge corresponds to the same symmetry mirror edge on both library blocks.

The illustrative embodiments are sometimes described herein using particular technologies only as an example for the clarity of the description.

It is noted that the description below may interchange various terms to refer to the same or similar components. For example, the term "layer" may be interchanged with "layer" with regard to describing certain exemplary embodiments. In another example, the term "edge" may be interchanged with "boundary" with regard to describing certain exemplary embodiments. In a further example, the term "circuit" may be interchanged with "circuitry" with regard to describing certain exemplary embodiments.

Figure 1:
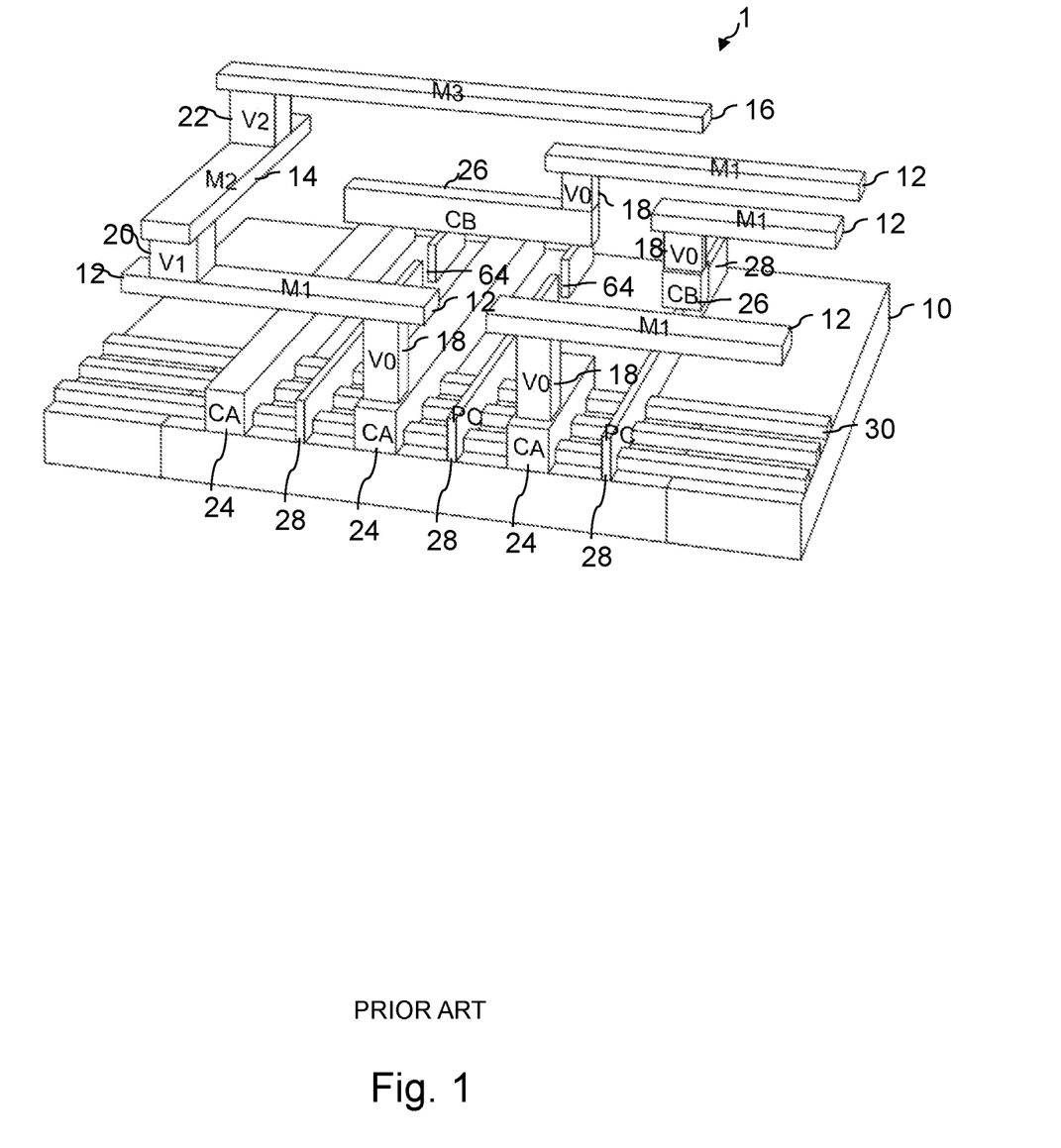
FIG. 1 depicts part of a three-dimensional design of an integrated circuit for manufacturing process according to state of the art.

FIG. 1 depicts part of a three-dimensional design of an integrated circuit 1 for manufacturing process according to state of the art.

A number of metal and semiconductor layers are depicted in a three-dimensional arrangement. A base layer is the diffusion area (RX) 10 on which parallel lines 30, so-called RXFIN lines, form the finFET transistor. The lines 30 are contacted by perpendicular contact active (CA) lines 24 as well as perpendicular polycontact (PC) lines 28. CA lines 24 are connected through vias (V0) with a first metal layer (M1) 12. PC lines 28 are connected by CB contact lines 26 through vias (V0) 18 with further M1 lines 12. M1 lines 12 are connected through vias (V1) 20 with a second metal layer (M2) 14. The second metal layer (M2) 14 is connected through vias (V2) 22 with a third metal layer (M3) 16. Breaks 64 are arranged in the PC lines 28.

Figure 2:
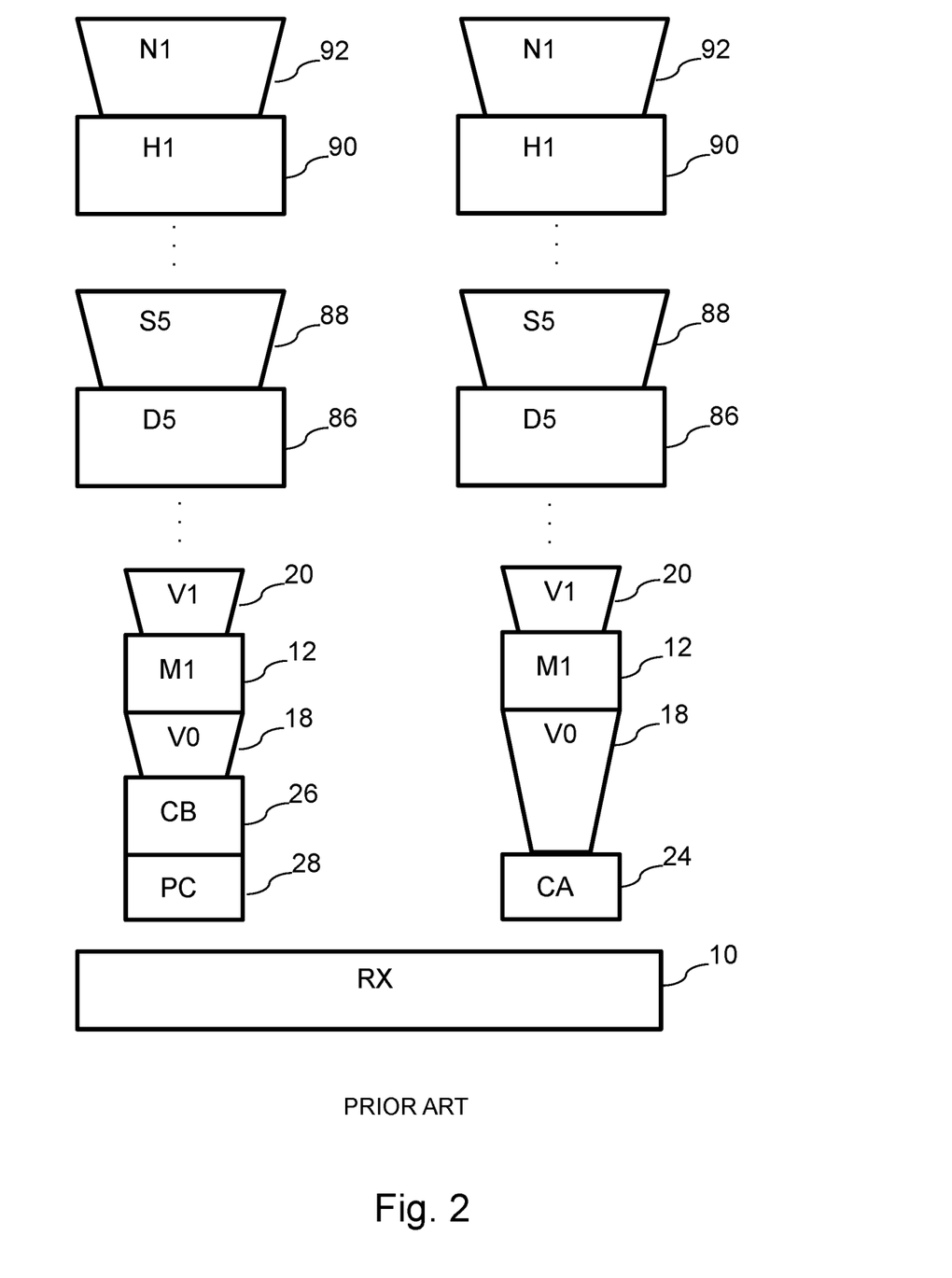
FIG. 2 depicts a metallization cross section of an integrated circuit according to FIG. 1.

FIG. 2 depicts a metallization cross section of the integrated circuit 1 of FIG. 1. A sequence of following layers on top of the RX layer 10 is shown. Metallization layers CA layer 24, via V0 18, M1 layer 12, and a second via V1 20 are placed on the right side, which may represent a drain/source contact of a finFET transistor, whereas on the left side instead of a CA layer 24 a polycontact (PC) 28, followed by a CB contact layer 26, a via V0 18 and a M1 layer 12 are placed, which may represent the gate contact of a finFET transistor. The metallization layers are thin layers for logic gates and connections to transistors.

On top of the metallization layers the so-called Dx layers for medium long distance chip routing are placed, e.g. the D5 layer 86 and the S5 layer 88.

On top of these Dx layers the so-called Hx layers for top level and external wires/contacts are placed, e.g. the H1 layer 90 and the N1 layer 92.

Figure 3:
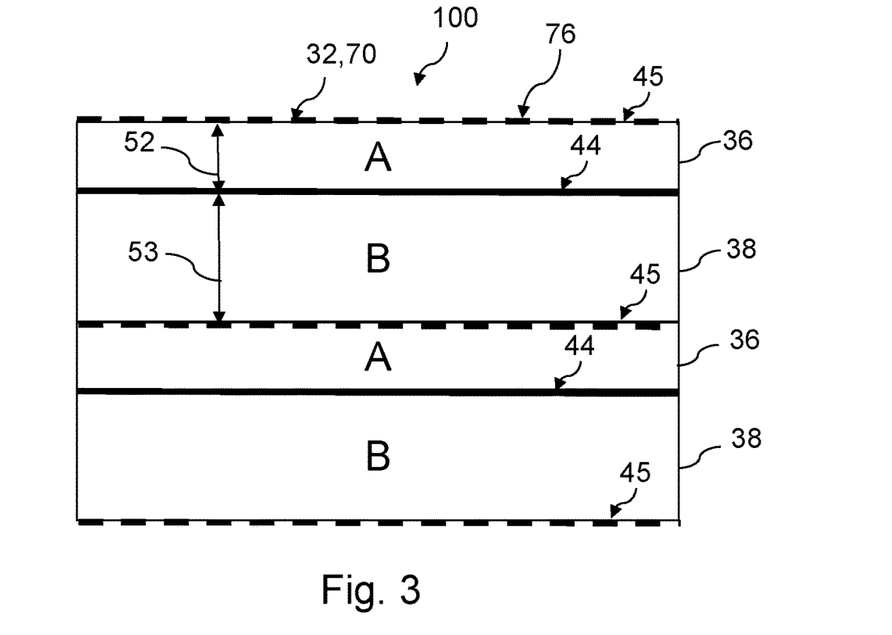
FIG. 3 depicts an arrangement of library blocks of a logic circuit library as part of a first area of an integrated circuit in accordance with the exemplary embodiments.

FIG. 3 depicts an arrangement of library blocks 36, 38 of a logic circuit library as part of a first area 32 of an integrated circuit 100 in accordance with the exemplary embodiments.

The integrated circuit 100 comprises a first area 32 including logic circuitry 70. The logic circuitry 70 comprises library blocks 36, 38 selected from a logic circuit library.

A first library block (A) 36 and a second library block (B) 38 are placed on top of each other to build a sequence ABAB. By this way a logic cell 76 may be implemented in the first area 32 of the integrated circuit 100.

The logic circuit library comprises the two library blocks 36, 38. Library block 36 has a first height 52 and the library block 38 has a second height 53. The first and second heights 52, 53 are different from each other. Adjacent groups of library blocks 36, 38 of the first area 32 are joined at their symmetry mirror edges 44, 45.

A library block 36, 38 is provided with at least two symmetry mirror edges 44, 45 perpendicular to a height 52, 53 of the library blocks 36, 38. The first symmetry mirror edge 44 is symbolized by solid line, whereas the second symmetry mirror edge 45 is symbolized with a broken line. Two adjacent library blocks 36, 38 are joined at a common symmetry mirror edge 44, 45. This may easily be achieved, if the first library block 36 is provided with the symmetry mirror edge 44 at the bottom and the symmetry mirror edge 45 at the top of the library block 36, and the second library block 38 is provided with the symmetry mirror edge 45 at the bottom and the symmetry mirror edge 44 at the top of the library block 38. Thus, the common symmetry mirror edge 44 is placed between A and B, whereas the common symmetry mirror edge 45 is placed between B and A.

A height unit of the height 50 of the logic cells 76 and the library blocks 36, 38 may correspond to a number of wire tracks 68 (as will be described below).

The symmetry mirror edges 44 and 45 may differ in their symmetrical qualities. The first symmetry mirror edge 44 may be configured as a positive channel metal oxide semiconductor PMOS region, in particular a row of PMOS transistors and the second symmetry mirror edge 45 may be configured as a negative channel metal oxide semiconductor NMOS region, in particular a row of NMOS transistors. Thus, two adjacent groups of library blocks 36, 38 may be placed with their PMOS region being adjacent to each other PMOS region or their NMOS region may be placed being adjacent to each other NMOS region.

Figure 4:
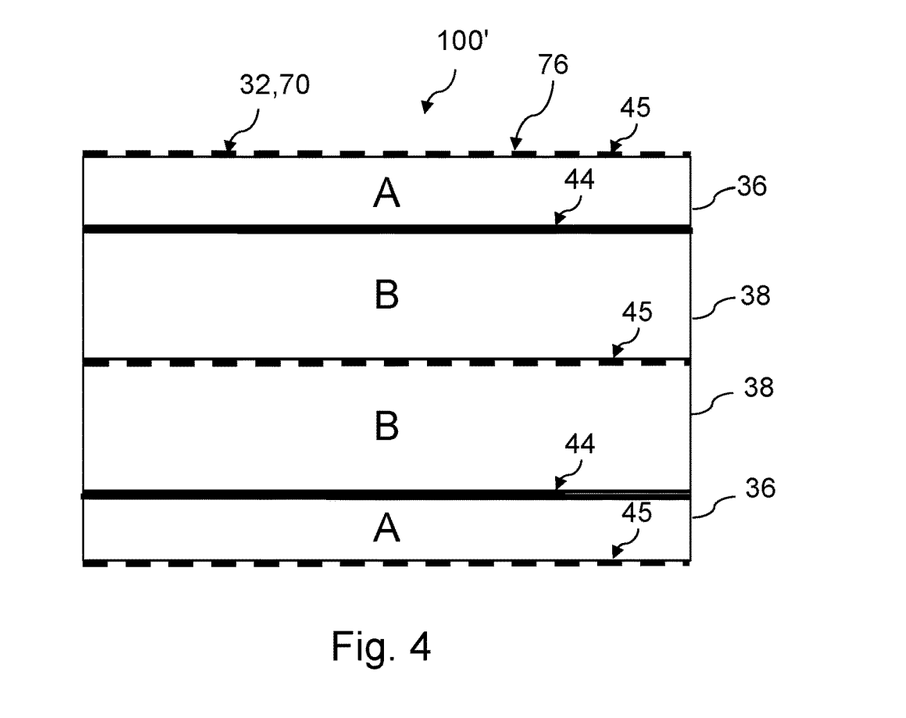
FIG. 4 depicts another arrangement of library blocks of a logic circuit library in accordance with the exemplary embodiments.

FIG. 4 depicts another arrangement of library blocks 36 of a logic circuit library of an integrated circuit 100' in accordance with the exemplary embodiments. In this embodiment the library blocks 36, 38 are placed in a sequence ABBA. According to this placement the library blocks in the lower half of the logic cell 76 are placed in a mirror symmetry compared with the placement in the upper half of the logic cell 76, which may be understood comparing the symmetry mirror edges 44, 45 of the library blocks 36, 38. In the lower half of the logic cell 76 the library block 38 is provided with the symmetry mirror edge 44 at the bottom and the symmetry mirror edge 45 at the top of the library block 38, whereas the library block 36 is provided with the symmetry mirror edge 45 at the bottom and the symmetry mirror edge 44 at the top of the library block 36. This is a mirror arrangement compared to the top half of the logic cell 76.

Figure 5:
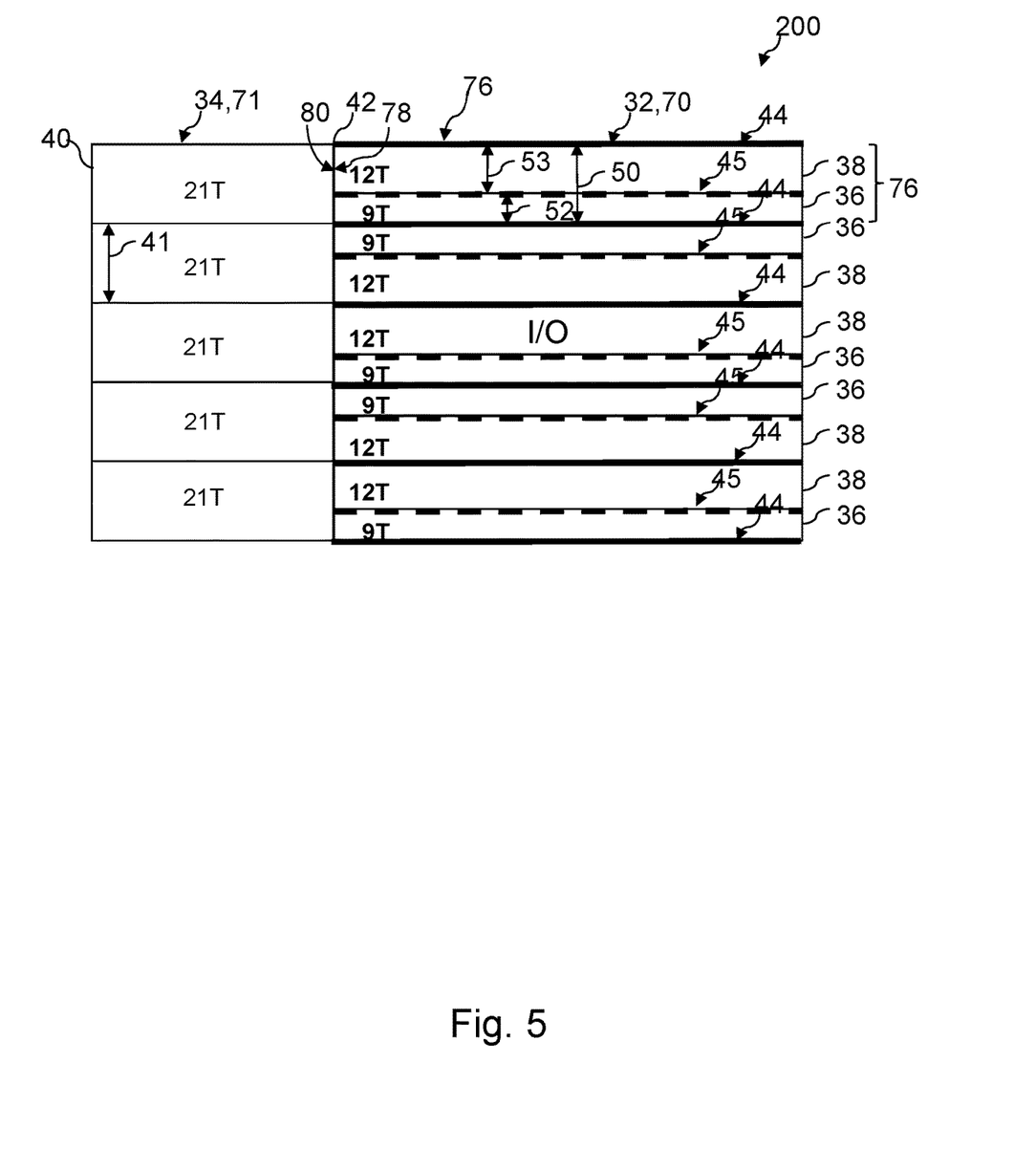
FIG. 5 depicts an integrated circuit with a first area comprising a logic circuitry and a second area comprising an array circuit in accordance with the exemplary embodiments.

FIG. 5 depicts an integrated circuit 200 with a first area 32 comprising a logic circuitry 70 and a second area 34 comprising an array circuit 71 in accordance with the exemplary embodiments.

The first area 70 and the second area 71 have a common boundary 42. The array circuit 71 is subdivided into multiple adjacent cells 40 placed in the second area 34 so that boundaries of the cells 40 correspond to the common boundary 42 where the logic circuitry 70 and the array circuitry 71 are joined. The height 41 of a cell 40 of the array circuitry 71 corresponds to the height 50, 52, 53 of one or more adjacent library blocks 36, 38 facing the cell 40 at the common edge 42. Corresponding cells 40 and library blocks 36, 38 are aligned to each other regarding their boundaries 78, 80 along the common edge 42.

The cells 40 have a height of 21 tracks (21T), whereas the library block 36 has a height 52 of 9 tracks (9T) and the library block 38 a height 53 of 12 tracks (12T). The library blocks 36, 38 are joined at their symmetry mirror edges 44, 45 alternatively according to the sequence of the library blocks 36, 38. Thus the library blocks 36, 38 are advantageously placed in a mirror arrangement according to the sequence shown in FIG. 4.

For the embodiment shown in FIG. 5, the combination of the two library blocks 36, 38 with heights 52, 53 of 9T and 12t equals the height of the cell 40 of the array circuit 71 of 21T. Thus, the cell 40 and the combination of two library blocks 36, 38 may match the same heights on the integrated circuit 100 and implemented in the layout of the integrated circuit 100 accordingly. The logic cell 76 of the first area 32 and the cell 40 of the second area 34 are aligned at the common boundary 42.

The library blocks 36, 38 of the circuit library may be combined by placing them one after the other along the common boundary 42 to form a combined logic cell 76, wherein the height 50 of the combined logic cell 76 is selectable in increments 51 smaller than the height 52, 53 of any library block 36, 38 available in the circuit library. The increment 51 corresponds to a height difference of two library blocks 36, 38.

Advantageously, several library blocks with different heights may be developed. The library blocks may be built adaptable to each other in combinations of the different heights. Thus, a full customized layout may be replaced by a combination of library blocks. The library blocks are images with a modular layout following a circuit row concept. The image layout may see an improved density due to interlocked image exceptions. This enables favourably a common library usage as well as this enables reuse of existing layouts. This modularization and standardization are key enablers to gain productivity.

Figure 6:
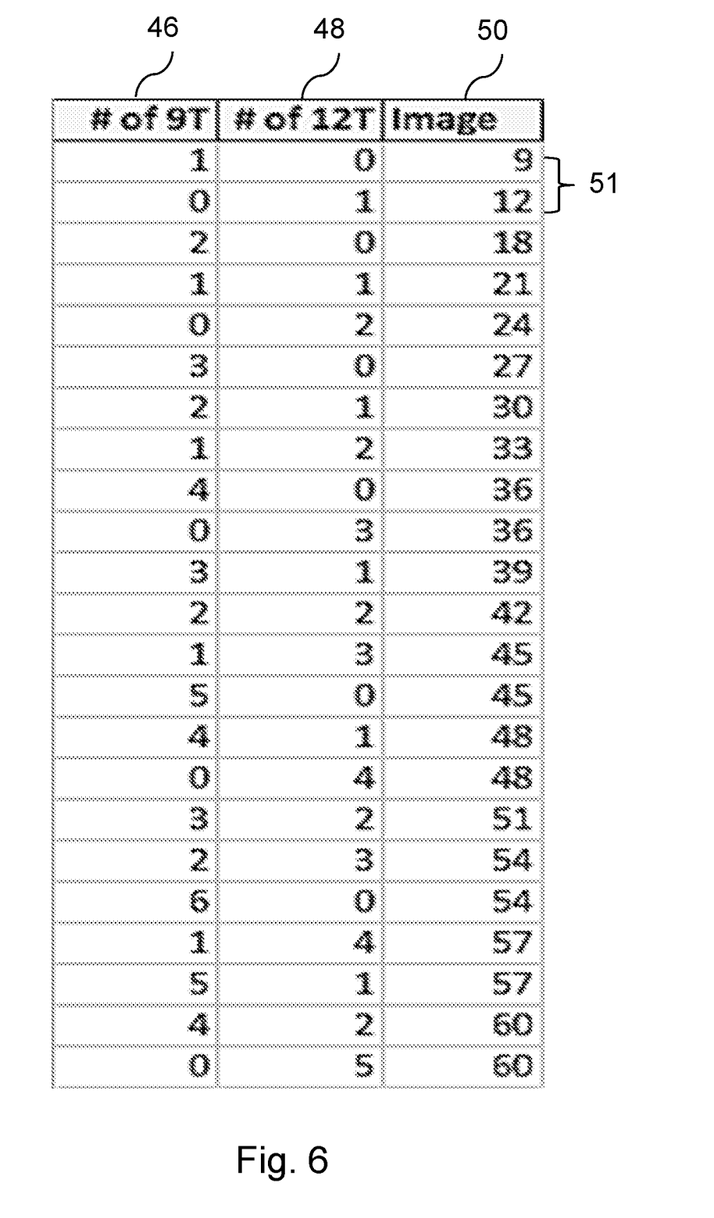
FIG. 6 depicts a table with heights of combinations of library blocks of a logic circuit library in accordance with the exemplary embodiments.

FIG. 6 depicts a table with heights 50 of combinations of library blocks 36, 38 of a logic circuit library in accordance with the exemplary embodiments. The table lists the total height 50 of a combination of a number 46 of 9T library blocks 36 and a number 48 of 12T library blocks 38. Increments 51 between different combinations of library blocks which may be represent a logic cell 76, may be extracted from the last column of the table with the heights 50 of the images.

Figure 7:
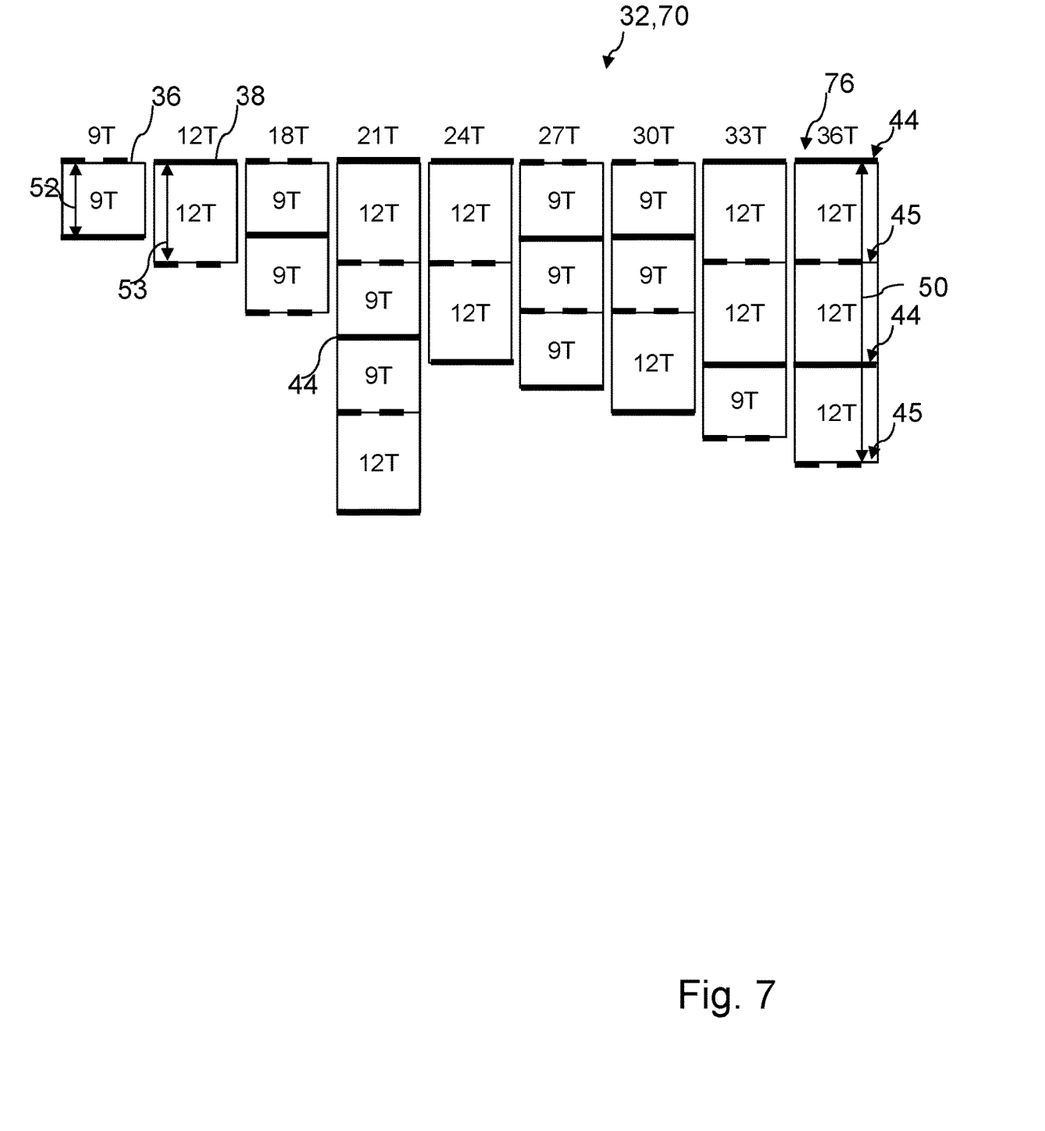
FIG. 7 depicts combinations of library blocks of the logic circuit library in accordance with the exemplary embodiments.

FIG. 7 depicts combinations of library blocks 36, 38 of the logic circuit library in accordance with the exemplary embodiments. The different heights 52, 53 of the two library blocks 36, 38 are marked for the single blocks. Reference signs are only marked at two representative library blocks 36, 38 for visibility reasons.

Different combinations of the library blocks 36, 38 may represent a different overall height 50 of a logic cell 76. The library blocks 36, 38 are joined at their common symmetry mirror edges 44, 45, marked by solid lines and broken lines, respectively. Thus, the symmetry mirror edges 44, 45 are alternating according to the combination of multiple library blocks 36, 38 one after the other. Joining three library blocks 36, 38 of the same kind may result in two different symmetry mirror edges 44, 45 inside the logic cell 76 as is depicted in the right most logic cell 76 comprising three library blocks 38 with a single height 53 of 12T.

The depicted building library block system favourably enables layout growth in increments of 3 tracks. Existing images (9T and 12T) may be reused. Thus a full custom layout may be replaced in most areas.

Figure 8:
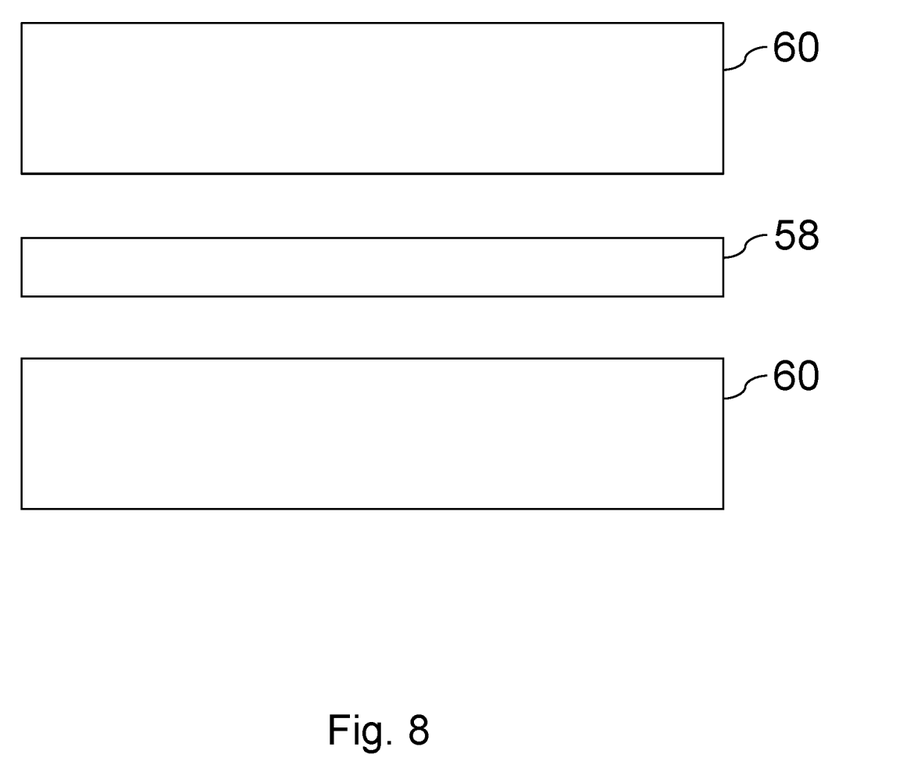
FIG. 8 depicts arrangement restrictions of wide and narrow wires for layout of an integrated circuit in accordance with the exemplary embodiments.

FIG. 8 depicts arrangement restrictions of wide and narrow wires for layout of the integrated circuit 100 in accordance with the exemplary embodiments. According to metal width and spacing requirements, a narrow wire 58 may be positioned between two adjacent wide wires 60. Distance rules depending on a wire width may be advantageously applied by placing the different wires 58, 60.

Figure 9:
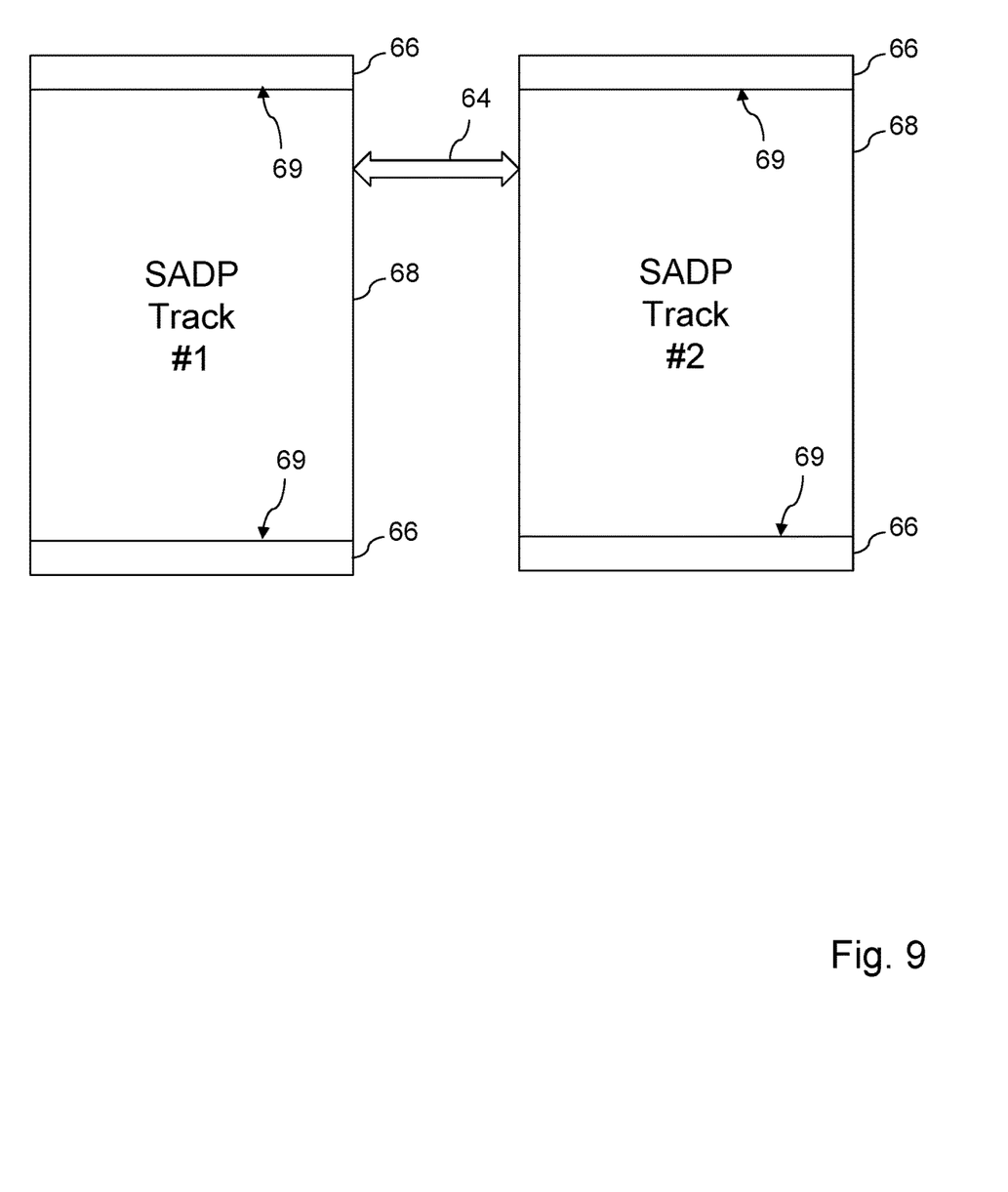
FIG. 9 depicts two regions as tracks with a break of a layout of an integrated circuit in accordance with the exemplary embodiments.

FIG. 9 depicts two patterning regions, manufactured according to a Self-Aligned Double Patterning (SADP) or other appropriate processes such as the Extreme Ultraviolet (EUV) method, as tracks 68 with a break 64 of a layout of an integrated circuit in accordance with the exemplary embodiments. Track #1 and track #2 exhibit different widths. A wide break 64 is provided or disposed between the two tracks 68 as an empty area, also known as no fly zone. A dummy wire 66 is provided at an edge 69 of a track 68. Different definitions of tracks 68 may advantageously be enclosed in a controlled manner at a boundary.

Figure 10:
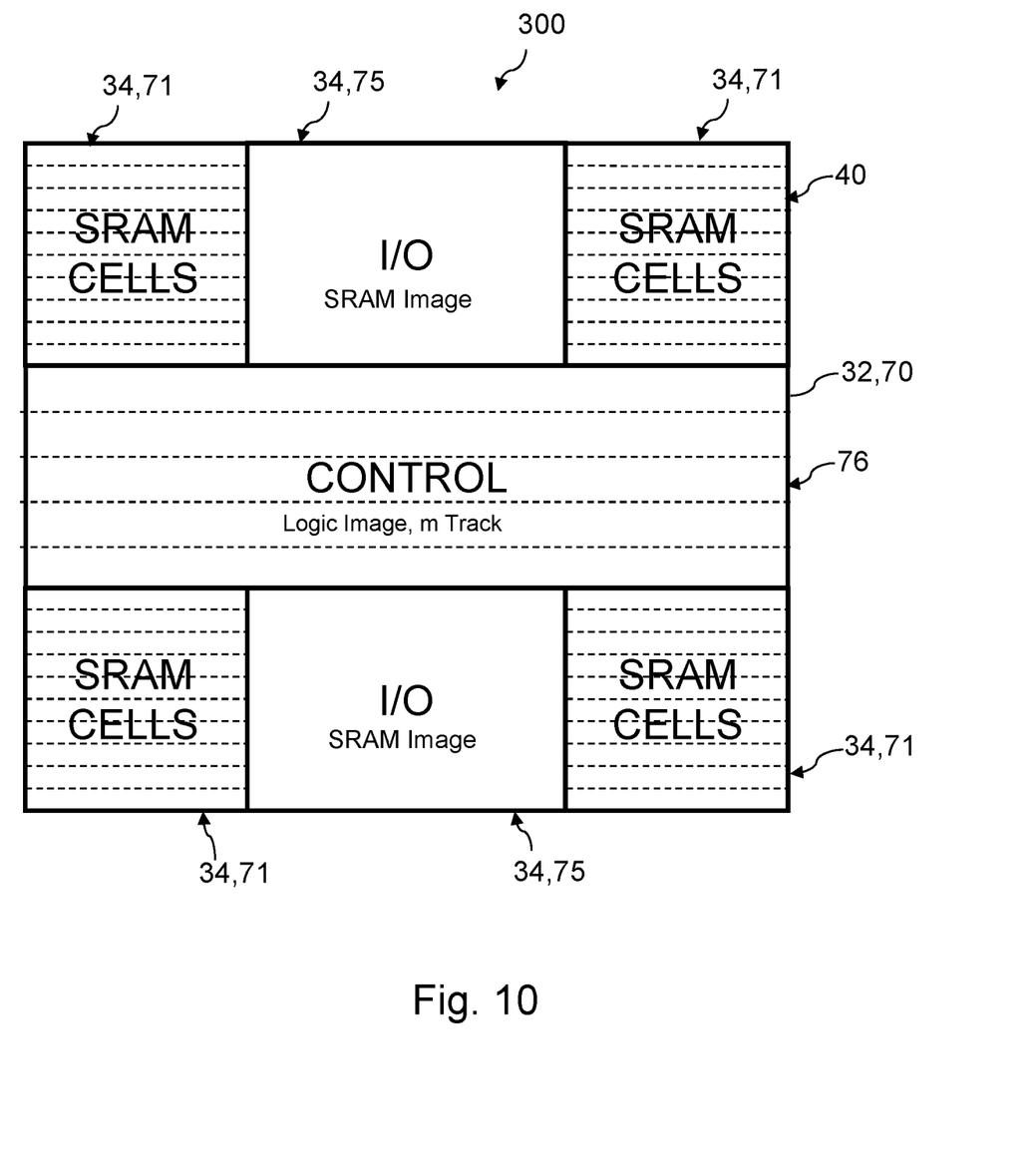
FIG. 10 depicts a layout of an integrated circuit with first area regions and second area regions in accordance with the exemplary embodiments.

FIG. 10 depicts a layout of an integrated circuit 300 with first area regions 32 and second area regions 34 in accordance with the exemplary embodiments. The integrated circuit 100 is designed according to the circuit row concept.

The layout exhibits a region of the array circuit 71 represented by four cell regions consisting of many SRAM cells 40 as well as input/output SRAM images 75 and a region of the logic circuitry 70 consisting of a control logic image with logic cells 76. Only one SRAM cell and only one logic cell 76 are marked by a reference number. The layout for a give logic cell may be optimized independently of layouts of other logic cells. The array circuit 71 may also comprise a register file cell that may be an SRAM array.

The input/output image 75 may comprise I/O circuits, latches, array circuits, as well as standard gates. The logic circuitry 70 may comprise library elements like standard gates, latches, and local clock buffers (LCB). The logic circuitry 70 may further comprise an input/output logic, in particular for the SRAM array or a transistor, in particular a finFET transistor.

It will be apparent to those skilled in the art that various modifications may be made in the present invention, without departing from the spirit or scope of the invention. Thus, it is intended that the present invention cover modifications and variations of this invention provided they come within the scope of the appended claims and their equivalent.

REFERENCE NUMERALS 10 diffusion area
12 metal layer M1
14 metal layer M2
16 metal layer M3
18 via V0

20 via V1
22 via V2
24 CA
26 CB
28 PC
30 RXFIN
32 first area
34 second area
36 library block
38 library block
40 regfile cell
41 regfile cell height
42 common boundary
44 symmetry mirror edge
45 symmetry mirror edge
46 column
48 column
50 logic cell height
51 increment
52 library block height
53 library block height
58 wire
60 wire
64 break
66 dummy wire
68 track
69 edge
70 logic circuitry
71 array circuit
75 I/O image
76 logic cell
78 boundary logic cell
80 boundary regfile cell
86 D5 layer
88 S5 layer
90 H1 layer
92 N1 layer
100 integrated circuit
100' integrated circuit
200 integrated circuit
300 integrated circuit

What is claimed is:

1. An integrated circuit comprising:
at least one first area including logic circuitry,
wherein the logic circuitry comprises library blocks selected from a logic circuit library, the logic circuit library comprising a first type library block having a first height and a second type library block having a second height, the first and second heights being different from each other,
wherein each of the first type library block and the second type library block is provided with at least two symmetry mirror edges perpendicular to a height of the library blocks,
wherein two adjacent ones of the library blocks are joined at a common symmetry mirror edge,
wherein the logic circuitry is configured to modularly assemble at least one of the first type library block and at least one of the second type library block such that the logic circuitry has a selectable total cell height.

2. The integrated circuit according to claim 1, wherein the common symmetry mirror edge comprises a first symmetry mirror edge configured as a positive channel metal oxide semiconductor (PMOS) region and a second symmetry mirror edge configured as a negative channel metal oxide semiconductor (NMOS) region.

3. The integrated circuit according to claim 2, wherein the PMOS region is a row of PMOS transistors and the NMOS region is a row of NMOS transistors.

4. The integrated circuit according to claim 3, wherein the two adjacent library blocks are placed with their PMOS region being adjacent to the other PMOS region or their NMOS region being adjacent to the other NMOS region.

5. The integrated circuit of claim 1, further comprising:
at least one second area including an array circuit, the first area and the second area having a common boundary, the array circuit being subdivided into multiple adjacent cells placed in the second area so that adjacent boundaries of the cells correspond to the common boundary,
wherein a height of at least one of the cells corresponds to a height of one or more adjacent ones of the library blocks facing the cell at the common boundary, at least one of the cells and at least one of the library blocks being aligned to each other regarding their boundaries along the common edge.

6. The integrated circuit according to claim 5, wherein the library blocks of the logic circuit library are configured to be combined by a placement one after the other along the common boundary to form a combined logic cell, a height of the combined logic cell configured to be selected in increments smaller than a height of any one of the library blocks available in the logic circuit library.

7. The integrated circuit according to claim 6, wherein the increment corresponds to a height difference of two of the library blocks.

8. The integrated circuit according to claim 5, wherein the array circuit comprises a register file cell, the logic circuitry comprises an input/output logic, or a combination thereof.

9. The integrated circuit of claim 8, wherein the register file cell is an SRAM array, wherein the input/output logic is for the SRAM array or a transistor, and wherein the input/output logic is a finFET transistor.

10. The integrated circuit according to claim 6, wherein the combined logic cell of the first area and the cell of the second area are aligned at the common boundary.

11. The integrated circuit according to claim 6, wherein a height of the logic cells and the library blocks correspond to a number of wire tracks.

12. The integrated circuit according to claim 6, wherein each of the logic cells has a layout optimized independently from layouts of other logic cells.

13. The integrated circuit according to claim 1, wherein the logic circuitry comprises narrow wires and wide wires, one of the narrow wires being positioned between two adjacent ones of the wide wires.

14. The integrated circuit according to claim 1, wherein the logic circuit has patterning regions including a plurality of tracks and a wide break disposed between two of the tracks as an empty area.

15. The integrated circuit according to claim 14, wherein the tracks have an edge on which a dummy wire is disposed.

* * * * *